(12) United States Patent
Bombaci et al.

(10) Patent No.: US 12,124,713 B2
(45) Date of Patent: Oct. 22, 2024

(54) SYSTEM-ON-CHIP COMPRISING A NON-VOLATILE MEMORY

(71) Applicants: STMICROELECTRONICS S.r.l., Agrate Brianza (IT); STMICROELECTRONICS (ROUSSET) SAS, Rousset (FR)

(72) Inventors: Francesco Bombaci, Messina (IT); Andrea Tosoni, Brignoles (FR)

(73) Assignees: STMICROELECTRONICS S.r.l., Agrate Brianza (IT); STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 18/057,390

(22) Filed: Nov. 21, 2022

(65) Prior Publication Data
US 2023/0168821 A1    Jun. 1, 2023

(30) Foreign Application Priority Data
Dec. 1, 2021 (FR) .................................... 2112807

(51) Int. Cl.
    *G06F 3/06* (2006.01)
(52) U.S. Cl.
    CPC .......... *G06F 3/0629* (2013.01); *G06F 3/0622* (2013.01); *G06F 3/0665* (2013.01); *G06F 3/0679* (2013.01)
(58) Field of Classification Search
    CPC .... G06F 3/0629; G06F 3/0622; G06F 3/0665; G06F 3/0679; G06F 2212/7207; G06F 12/0246; G06F 8/654; G06F 2212/1012; G06F 2212/7202; G11C 16/105; G11C 8/12
    See application file for complete search history.

(56) References Cited

U.S. PATENT DOCUMENTS

| | | | |
|---|---|---|---|
| 2005/0141312 A1 | 6/2005 | Sinclair et al. | |
| 2008/0022278 A1* | 1/2008 | Gschwind | G06F 9/5027 718/100 |
| 2009/0019217 A1* | 1/2009 | Gorobets | G06F 11/1415 711/170 |
| 2012/0023365 A1* | 1/2012 | Byom | G06F 12/0246 711/E12.001 |

(Continued)

*Primary Examiner* — Tasnima Matin
(74) *Attorney, Agent, or Firm* — Seed IP Law Group LLP (57) ABSTRACT

A system-on-chip includes a processor, a memory and a memory interface coupled to the processor and to the memory. The processor, in operation, generates memory access requests. The memory includes one or more physical banks divided into a succession of sectors, each sector having a size equal to a smallest erasable size of the memory. The memory interface, in operation, responds to receiving memory configuration information by storing logical memory bank configuration information in the one or more configuration registers, the logical memory bank configuration information assigning each sector of the one or more physical banks of the memory to a respective logical memory bank of one or more logical memory banks. The memory interface, in operation, controls access to the memory by the processor based on the logical memory bank configuration information stored in the one or more configuration registers.

19 Claims, 4 Drawing Sheets

(56) References Cited

U.S. PATENT DOCUMENTS

| | | |
|---|---|---|
| 2014/0041026 A1* | 2/2014 | Scott ................. G06F 21/53 |
| | | 726/22 |
| 2017/0249250 A1 | 8/2017 | Ramanujan et al. |
| 2018/0011802 A1* | 1/2018 | Ndu ................ G06F 12/0891 |
| 2018/0060065 A1* | 3/2018 | Lai ..................... G06F 8/71 |
| 2019/0012271 A1* | 1/2019 | Avoinne ............. G06F 12/145 |
| 2019/0026477 A1* | 1/2019 | Smith .................. G06F 21/71 |
| 2019/0073161 A1* | 3/2019 | Nale ................... G06F 13/20 |
| 2020/0304142 A1* | 9/2020 | Nakanishi ........... H03M 7/3059 |
| 2022/0121570 A1* | 4/2022 | Eilert ................ G06F 3/0659 |
| 2022/0278837 A1* | 9/2022 | Grobelny ............ G06F 21/54 |

* cited by examiner

SYSTEM-ON-CHIP COMPRISING A NON-VOLATILE MEMORY

BACKGROUND

Technical Field

The embodiments and implementations relate to non-volatile memories, and more particularly to the management of such memories.

Description of the Related Art

A system-on-chip is an integrated circuit that may include a non-volatile memory. This memory can be used to store a compiled code of an application which can be executed by a processor of this system-on-chip.

The non-volatile memory of the system-on-chip can be organized into one or more memory banks. A memory bank is an area of the memory which is typically autonomous in address, control and power supply couplings. Generally, a non-volatile memory is composed of one or two banks. The organization of the memory is defined during the design of the system-on-chip. The memory banks are therefore defined physically in the system-on-chip. In the following reference is made to physical banks, the memory banks which are defined physically in the system-on-chip.

Each physical bank is divided into sectors. These sectors correspond to a minimal erasable unit of the memory. Indeed, an erasure in the memory cannot be performed by bit but is performed by sector due to the physical constraints of the memory.

The sectors of a memory which are intended to contain at least one compiled code generally have the same size and their number in a physical bank is a power of two.

The stored application is compiled to operate from a start-up address (also referred to as a "boot address") in the memory. On starting up an application stored in the memory, the processor looks for the compiled code of the application to run at the start-up address. If there is no executable code at this address, the processor locks and the system-on-chip usually becomes unusable.

Furthermore, it may be important to preserve a portion of the memory at a fixed address from deletion to ensure a root of trust and be able to certify the origin and the authenticity of each installed code.

Furthermore, it is advantageous to have a memory configured to allow the update of a compiled code of an application with a new version of this code without having to interrupt the execution of the application. In addition, it is desirable that the system-on-chip can resume an update of the compiled code of the application after restarting the system-on-chip following an interruption in its power supply during the update.

Nevertheless, the organization of the physical memory banks defined during the design of the memory does not always make it possible to respond to all of these points. In addition, the organization of the physical banks is not always adapted to the needs of a user.

BRIEF SUMMARY

In an embodiment, a system-on-chip includes a processor, a memory and a memory interface coupled to the processor and to the memory. The processor, in operation, generates memory access requests. The memory includes one or more physical banks divided into a succession of sectors, each sector having a size equal to a smallest erasable size of the memory. The memory interface, in operation, responds to receiving memory configuration information by storing logical memory bank configuration information in the one or more configuration registers, the logical memory bank configuration information assigning each sector of the one or more physical banks of the memory to a respective logical memory bank of one or more logical memory banks. The memory interface, in operation, controls access to the memory by the processor based on the logical memory bank configuration information stored in the one or more configuration registers.

In an embodiment, a method comprises storing logical memory bank configuration information in one or more configuration registers of a memory interface coupled to a memory of a system-on-a-chip, the memory including one or more physical banks divided into a plurality of sectors, each sector having a size equal to a smallest erasable size of the memory, the stored logical memory bank configuration information assigning each sector of the one or more physical banks of the memory to a respective logical memory bank of one or more logical memory banks. Access to the memory by a processor of the system-on-a-chip is controlled based on the logical memory bank configuration information stored in the one or more configuration registers.

In an embodiment, a non-transitory computer-readable medium's contents cause a processing system to perform a method. The method comprises storing logical memory bank configuration information in one or more configuration registers of a memory interface coupled to a memory of a system-on-a-chip, the memory including one or more physical banks divided into a plurality of sectors, each sector having a size equal to a smallest erasable size of the memory, the stored logical memory bank configuration information assigning each sector of the one or more physical banks of the memory to a respective logical memory bank of one or more logical memory banks. Access to the memory by a processor of the system-on-a-chip is controlled based on the logical memory bank configuration information stored in the one or more configuration registers.

In an embodiment, a device comprises a host processor and a system-on-a-chip coupled to the host processor. The system-on-a-chip includes one or more processing cores, a memory, and a memory interface coupled to the one or more processing cores and to the memory. The one or more processing cores, in operation, generate memory access requests. The memory includes one or more physical banks divided into a succession of sectors, each sector having a size equal to a smallest erasable size of the memory. The memory interface includes one or more configuration registers. The memory interface, in response to received memory configuration information, stores logical memory bank configuration information in the one or more configuration registers, the logical memory bank configuration information assigning each sector of the one or more physical banks of the memory to a respective logical memory bank of one or more logical memory banks. In response to receiving a memory access request from the one or more processing cores, the memory interface controls access to the memory based on the logical memory bank configuration information stored in the one or more configuration registers.

BRIEF DESCRIPTION OF THE SEVERAL VIEWS OF THE DRAWINGS

Further advantages and features of embodiments are given in the detailed description of non-limiting implementations and examples and the attached drawings in which.

DETAILED DESCRIPTION

Figure 1:
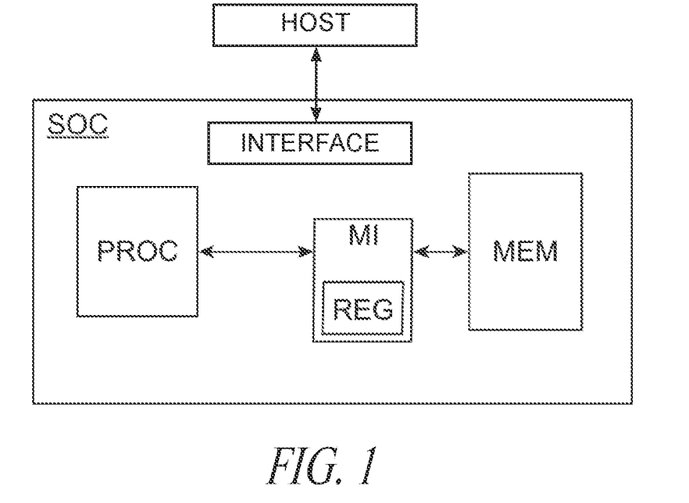
FIG. 1 illustrates a system on a chip (SOC) according to an embodiment.

FIG. 1 illustrates a system-on-chip SOC according to an embodiment. The system-on-chip SOC comprises a processor PROC, a memory MEM and a memory interface MI.

The memory MEM is configured to store a compiled code of an application. The application can provide one or more services which can be implemented on execution of the application by the processor PROC.

Figure 2:
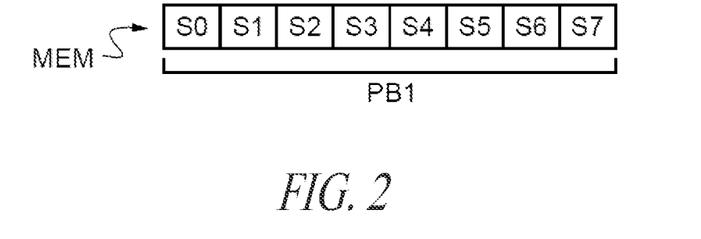
FIGS. 2-4 illustrate example embodiments of a memory having one or more physical banks divided into sectors.
Figure 3:
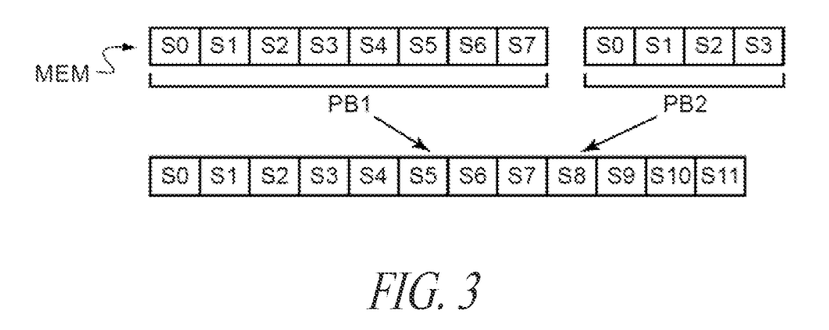
Figure 4:
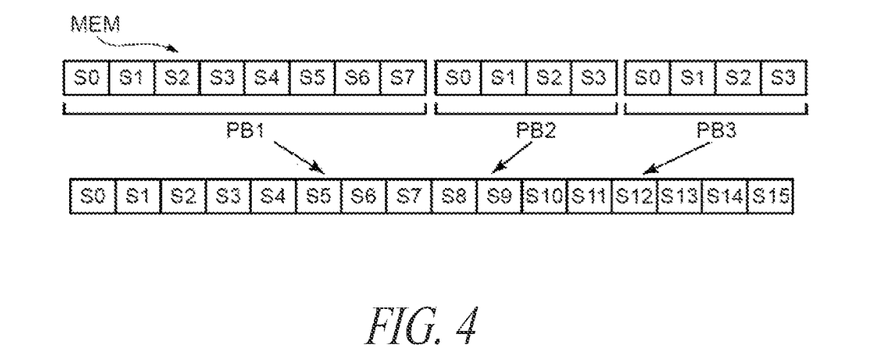

The memory MEM comprises one or more physical banks which are divided into a succession of sectors Sn. Each sector has a size corresponding to a minimum memory size which can be erased. FIG. 2 illustrates an example of memory comprising a physical bank PB1 divided into eight sectors S0 to S7. Alternatively, FIG. 3 illustrates an example of memory MEM comprising a first bank PB1 divided into eight sectors S0 to S7 and a second bank PB2 divided into four sectors S0 to S3. The two banks PB1 and PB2 then form a succession of twelve sectors S0 to S11. FIG. 4 corresponds to another variant of a memory. This memory MEM comprises a first bank PB1 divided into eight sectors S0 to S7, a second bank PB2 divided into four sectors S0 to S3 and a fourth bank PB2 divided into four sectors S0 to S3. The three banks PB1, PB2 and PB3 then form a succession of twelve sectors S0 to S15.

The sectors are used to store the compiled code of the application. In particular, the memory can be organized into one or more physical memory banks. The sectors of the memory are then distributed in the physical memory banks. More particularly, each physical bank comprises successive sectors of the memory.

The memory MEM is a non-volatile memory, for example a flash memory.

Referring to FIG. 1, the memory interface MI is configured to manage the access requests to the memory from the processor PROC. Furthermore, the memory interface comprises configuration registers REG to enable the definition of one or more logic memory banks, the memory sectors then being assigned to this or these logic memory banks. The definition of one or more logic banks allows a user to abstract from the physical organization of the memory and thus the physical banks of the memory. The memory interface MI may comprise, for example, a processing core, a state machine, discrete circuitry, etc., or combinations thereof, which, in operation, stores configuration information in the configuration registers and controls access to the memory in accordance with the configuration information. The SoC as illustrated also comprises an interface INTERFACE, which, in operation, couple the SoC to one or more other devices or systems (e.g., to an external peripheral device, to a host system, etc.).

The processor PROC is adapted to output configuration instructions for configuring said configuration registers by the memory interface MI.

FIGS. 5 to 9 illustrate different possible configurations of the memory MEM which are described in the following. These different configurations respect the given conditions. In particular, in each possible configuration, all sectors of the memory are assigned to respective logic banks. In addition, each sector is assigned to a single logical bank. In an embodiment, the sectors assigned to the same logical bank are successive sectors of the memory.

Furthermore, it is possible to define a logic bank F used for storing a fixed compiled code, in particular a compiled code which can be used as a root of trust. This compiled code can be used for starting the application. This logic bank F is not interchangeable.

It is also possible to define at least one logic bank A, B for storing different versions of an application for example. When the memory MEM comprises a plurality of logic banks A, B, the logic banks A, B may be interchangeable.

In order to configure the memory, the configuration instruction output by the processor PROC provides several pieces of information. In particular, it is necessary to indicate the number of sectors to be assigned to the logic bank F and to indicate whether it is desired to also have interchangeable logic banks A, B.

The number of sectors to be assigned to the logic bank F can vary between zero and the total number of memory sectors. The remaining sectors can then be assigned to a single logic bank A or to two logic banks A and B, depending on whether it is desired to have interchangeable logic banks.

If it is not desired to have interchangeable logic banks, then in an embodiment, all of the remaining sectors are assigned to the logic bank A. If it is desired to have interchangeable logic banks, then in an embodiment the remaining sectors may be assigned so that the same number of sectors is assigned to logic bank A and logic bank B.

It can also be possible to lock the desired configuration by providing locking information to the memory interface. When the memory configuration is locked, it is no longer possible to change the configuration of the logic banks. Nevertheless, it is still possible to interchange the two banks A and B if the memory configuration allows it.

As mentioned above, FIGS. 5 to 9 illustrate different possible configurations of a memory MEM comprising a succession of eight sectors S0 to S7.

Figure 5:
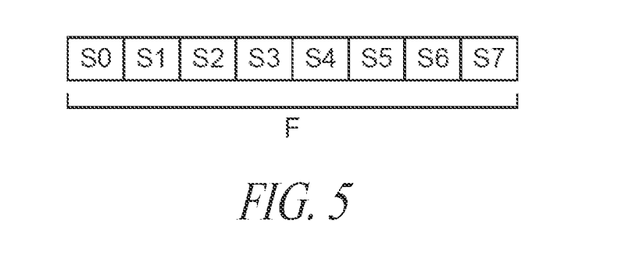
FIGS. 5-9 illustrate example configurations of an embodiment of a memory.

In one possible memory configuration, all of the sectors of the memory can be assigned to a logic bank F. For example, as shown in FIG. 5, sectors S0 to S7 are assigned to the logic bank F.

Figure 6:
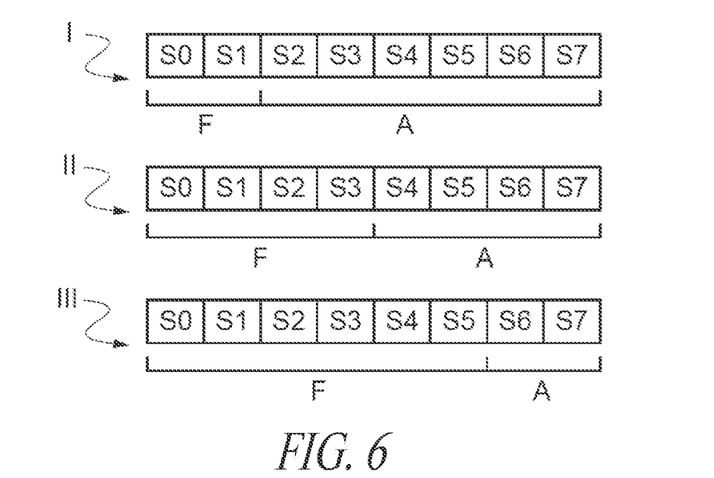

Alternatively, as shown in the different embodiments of FIG. 6, certain memory sectors can be assigned to a logic bank F and the remaining memory sectors can be assigned to a logic bank A.

In particular, the number of memory sectors assigned to the logic bank F may be less than the number of memory sectors assigned to the logic bank A. For example, as illustrated in embodiment I, two sectors S0, S1 are assigned to the logic bank F and six sectors S2 to S7 are assigned to the logic bank A.

Alternatively, the number of memory sectors assigned to the logic bank F can be equal to the number of memory sectors assigned to the logic bank A. For example, as illustrated in the embodiment II, four sectors S0 to S3 are assigned to the logic bank F and four sectors S4 to S7 are assigned to the logic bank A.

Alternatively, the number of memory sectors assigned to the logic bank F may be greater than the number of memory sectors assigned to the logic bank A. For example, as illustrated in the embodiment III, six sectors S0 to S5 are assigned to the logic bank F and two sectors S6, S7 are assigned to the logic bank A.

Figure 7:
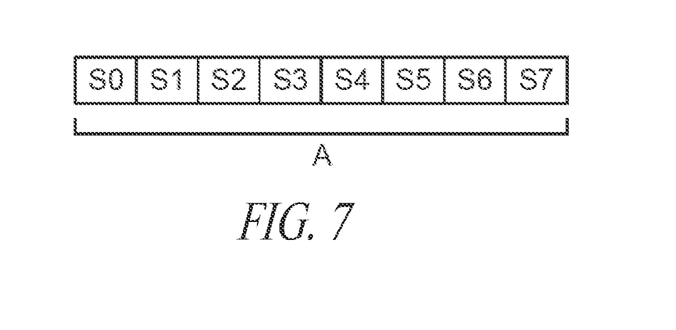

Alternatively, all of the memory sectors can be assigned to a logic bank A. No sector is then assigned to a logic bank F. For example, as shown in FIG. 7, sectors S0 to S7 are assigned to the logic bank A.

Figure 8:
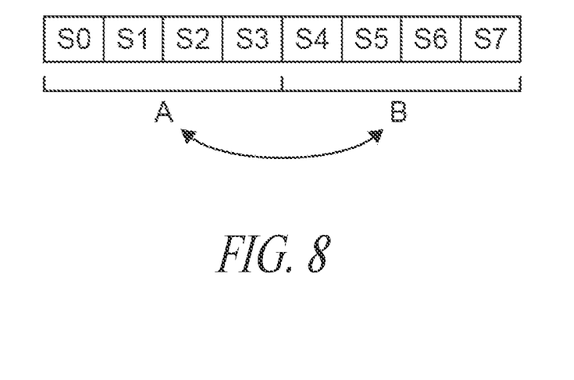

Alternatively, one half of the memory sectors can be assigned to a logic bank A and the other half of the sectors of the memory can be assigned to a logic bank B. No sector is then assigned to a bank F. For example, as illustrated in FIG. 8, sectors S0 to S3 are assigned to the logic bank A and sectors S4 to S7 are assigned to the logic bank B.

Such an assignment can be used to allow the logic banks A and B to be interchanged.

Figure 9:
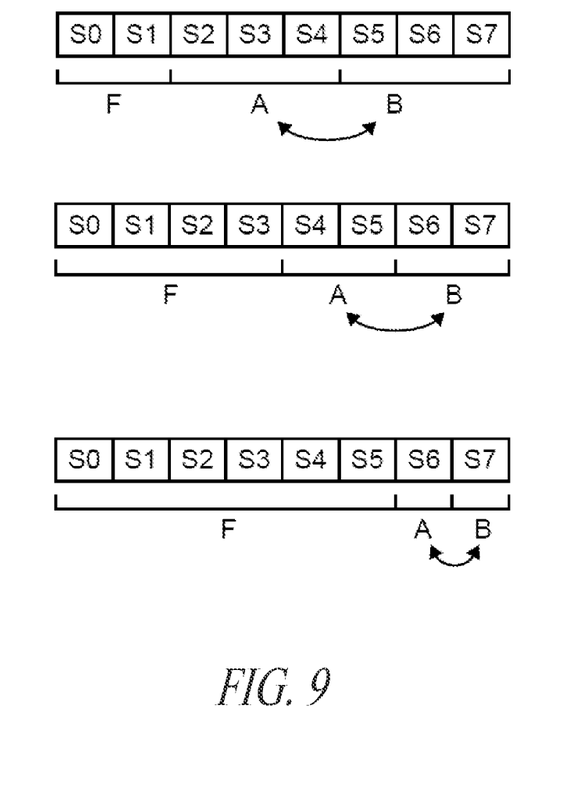

Alternatively, some sectors of the memory can be assigned to a logic bank F, some other sectors of the memory can be assigned to a logic bank A, and other sectors of the memory can be assigned to a logic bank B. In an embodiment, the number of sectors assigned to the logic bank A is same as that of the sectors assigned to the logic bank B. For example, as shown in FIG. 9, sectors S0 and S1 are assigned to the logic bank F, sectors S2 to S4 are assigned to the logic bank A and sectors S5 to S7 are assigned to the logic bank B. Alternatively, sectors S0 and S3 are assigned to the logic bank F, sectors S4 and S5 are assigned to the logic bank A and sectors S6 and S7 are assigned to the logic bank B. In another variant of the implementation, alternatively, sectors S0 to S5 are assigned to the logic bank F, sector S6 is assigned to the logic bank A and sector S7 is assigned to the logic bank B.

Figure 10:
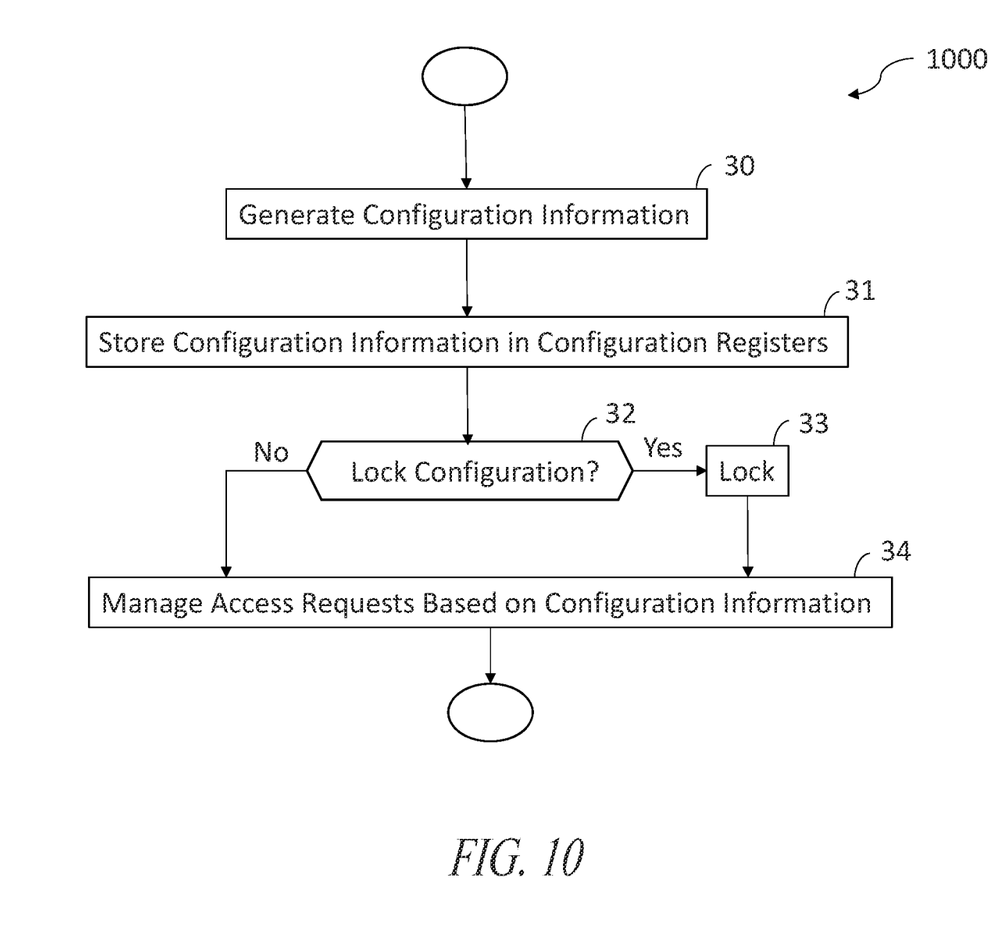
FIG. 10 illustrates an example embodiment of a method of managing a memory interface of a system on a chip.

FIG. 10 illustrates such a method 1000 for managing the memory MEM. The method comprises a step 30, in which a new configuration of at least one logic bank is output by the processor PROC and received by the configuration registers of the memory interface MI. The new configuration may take the form of configuration information, instructions, etc.

Then in step 31, the memory interface reads the received configuration, e.g., a configuration instruction and then defines said at least one logic bank according to this instruction. For example, the memory interface generates configuration information to configure logical memory banks based on a received instruction and stores the configuration information in the registers REG.

Optionally, in step 32, a determination is made as to whether the configuration should be locked. For example, the configuration information received at 30 may indicate whether the configuration information is to be locked. When it is determined at 32 to lock the configuration information, the method 1000 proceeds from determination 32 to step 33, where the configuration information is locked. Otherwise, the method 1000 proceeds from 32 to 34.

Once the structure of the memory is defined by the memory interface, the memory interface is configured to manage the access to the memory 34 by the processor PROC based on the configuration information stored in the registers.

In particular, the processor PROC is configured to output memory access requests. These requests are received by the memory interface MI. Each access request indicates a memory address to be accessed. The memory interface MI is configured to decode the instructions that it receives. In particular, the memory interface is configured to determine whether the address given is valid. If the reported address is valid, then the memory interface MI can authorize access to the memory sectors assigned to this logic bank.

Such a system-on-chip allows the configuration of logic banks to be abstracted from the configuration of the physical banks defined during the design of the system-on-chip.

Thus, the storage of the compiled code of the application can be done independently of the organization of the physical banks of the memory. In particular, the compiled code can be recorded in the sectors assigned to the same logic memory bank. Each logic bank is accessible at a fixed address. The application code can thus be developed then complied without having to take into account the organization of the physical memory banks. A user of the system-on-chip therefore has access to the entire memory.

System-on-chip may be summarized as including a memory (MEM) including one or more physical banks divided into a succession of sectors (Sn, S1, . . . , S15), each sector having a size equal to the smallest erasable size of the memory, a memory interface (MI) adapted to control access to said memory (MEM) and including at least one configuration register (REG) adapted to be able to define at least one logic memory bank (F, A, B) by assigning the sectors (S1, . . . , Sn) of the memory to said at least one logic bank, each sector of the memory being assigned to a single logic bank, and a processor (PROC) connected to said memory interface, and adapted to configure said configuration register.

The memory sectors which can be assigned (Sn, S1, . . . , S15) to a same logic bank by the memory interface (MI) may be successive sectors.

Said at least one configuration register (REG) may be adapted to define a single logic memory bank (F, A), all of the sectors of the memory being then assigned to this logic bank (F, A).

Said at least one configuration register (REG) may be adapted to define a single logic memory bank (F) for storing a compiled code used as a root of trust.

Said at least one configuration register (REG) may be adapted to define a single logic memory bank (A) for storing a compiled code of an application.

Said at least one configuration register may be adapted to define a plurality of logic memory banks (F, A, B), such that the memory interface defines said logic banks at different addresses.

Said at least one configuration register (REG) may be adapted to define a first logic bank (F) for storing a compiled code used as a root of trust and a second logic bank (A) for storing a compiled code of an application.

Said at least one configuration register (REG) may be adapted to define a first logic bank (A) for storing a compiled code of an application and a second logic bank (B) for storing an updated version of the compiled code of the application, these two logic banks (A, B) having an equal number of memory sectors assigned to them and being interchangeable.

Said at least one configuration register (REG) may be adapted to define a first logic bank (F) for storing a compiled code used as a root of trust, a second logic bank (A) for storing a compiled code of an application and a third logic (B) bank for storing an updated version of the compiled code of the application, the second logic bank (A) and the third logic bank (B) having a same number of memory sectors which are assigned thereto and being interchangeable.

Said at least one configuration register (REG) may be configured to lock the configuration defining the said at least one logic bank.

Method of managing a memory (MEM), the memory (MEM) having one or more physical banks divided into a succession of sectors (Sn, S1, . . . , S15), each sector having a size equal to the smallest erasable size of the memory, the sectors being associated with a physical memory bank, the method may be summarized as including a memory configuration for defining at least one logic memory bank (F, A, B) by assigning the sectors (Sn, S1, . . . , S15) of the physical memory to said at least one logic bank, each sector of the memory being assigned to a single logic bank.

The memory sectors (Sn, S1, . . . , S15) assigned to a same logic bank (F, A, B) may be successive sectors.

The memory configuration may be used to define a single logic bank (F, A), all of the sectors of the memory being then assigned to this logic bank (F, A).

The memory configuration may be used to define a single logic memory bank (F) for storing a compiled code used as a root of trust.

The memory configuration may be used to define a single logic memory bank (A) for storing a compiled code of an application.

The memory configuration may be used to define a plurality of logic memory banks (F, A, B) at different addresses.

The memory configuration may be used to define a first logic bank (F) for storing a compiled code used as a root of trust and a second logic bank (A) for storing a compiled code of an application.

The memory configuration may be used to define a first logic bank (A) for storing a compiled code of an application and a second logic bank (B) for storing an updated version of the compiled code of the application, these two logic banks (A, B) having the same number of memory sectors which are assigned to them and being interchangeable.

The memory configuration may be used to define a first logic bank (F) for storing a compiled code used as a root of trust, a second logic bank (A) for storing a compiled code of an application and a third logic bank (B) for storing an updated version of the compiled code of the application, the second logic bank (A) and the third logic bank (B) having the same number of memory sectors which are assigned to them and being interchangeable.

In an embodiment, a system-on-chip includes a processor, a memory and a memory interface coupled to the processor and to the memory. The processor, in operation, generates memory access requests. The memory includes one or more physical banks divided into a succession of sectors, each sector having a size equal to a smallest erasable size of the memory. The memory interface, in operation, responds to receiving memory configuration information by storing logical memory bank configuration information in the one or more configuration registers, the logical memory bank configuration information assigning each sector of the one or more physical banks of the memory to a respective logical memory bank of one or more logical memory banks. The memory interface, in operation, controls access to the memory by the processor based on the logical memory bank configuration information stored in the one or more configuration registers. In an embodiment, memory sectors assigned to a same logical memory bank are successive sectors of the one or more physical banks.

In an embodiment, the one or more logical memory banks comprise a single logical memory bank and all of the sectors of the memory are assigned to the single logical memory bank. In an embodiment, the single logical memory bank, in operation, stores compiled code used as a root of trust. In an embodiment, the single logical memory bank, in operation, stores compiled code of an application.

In an embodiment, the one or more logical memory banks comprise a plurality of logical memory banks, and the memory interface defines the plurality of logical memory banks at different addresses. In an embodiment, the stored logical memory bank configuration information defines a first logical memory bank to store compiled code used as a root of trust and a second logical memory bank to store compiled code of an application. In an embodiment, the stored logical memory bank configuration information defines a first logical memory bank to store compiled code of an application and a second logical memory bank to store an updated version of the compiled code of the application, the first and second logical memory banks having an equal number of assigned memory sectors and being interchangeable. In an embodiment, the stored logical memory bank configuration information defines a first logical memory bank to store compiled code used as a root of trust, a second logical memory bank to store a compiled code of an application, and a third logical memory bank to store an updated version of the compiled code of the application, the second logical bank and the third logical bank having a same number of assigned memory sectors and being interchangeable.

In an embodiment, the memory interface, in operation, locks the stored logical memory bank configuration information. In an embodiment, the processor, in operation, generates the memory configuration information received by the memory interface.

In an embodiment, a method comprises storing logical memory bank configuration information in one or more configuration registers of a memory interface coupled to a memory of a system-on-a-chip, the memory including one or more physical banks divided into a plurality of sectors, each sector having a size equal to a smallest erasable size of the memory, the stored logical memory bank configuration information assigning each sector of the one or more physical banks of the memory to a respective logical memory bank of one or more logical memory banks. Access to the memory by a processor of the system-on-a-chip is controlled based on the logical memory bank configuration information stored in the one or more configuration registers. In an embodiment, the stored logical memory bank configuration information assigns memory sectors of a same logical memory bank to successive sectors of the one or more physical banks.

In an embodiment, the stored logical memory bank configuration information assigns all of the sectors of the memory to a single logical memory bank. In an embodiment, the stored logical memory bank configuration information defines the single logical memory bank to store compiled code used as a root of trust. In an embodiment, the stored logical memory bank configuration information defines the single logical memory bank to store compiled code of an application.

In an embodiment, the stored logical memory bank configuration information defines a plurality of logical memory banks at different addresses. In an embodiment, the stored logical memory bank configuration information defines a first logical memory bank to store compiled code used as a root of trust and a second logical memory bank to store compiled code of an application. In an embodiment, the stored logical memory bank configuration information defines a first logical memory bank to store compiled code of an application and a second logical memory bank to store an updated version of the compiled code of the application, the first and second logical memory banks having an equal number of assigned memory sectors and being interchangeable. In an embodiment, the stored logical memory bank configuration information defines a first logical memory bank to store compiled code used as a root of trust, a second logical memory bank to store a compiled code of an application, and a third logical bank to store an updated version of the compiled code of the application, the second logical bank and the third logical bank having a same number of assigned memory sectors and being interchangeable.

In an embodiment, the method comprises locking the stored logical memory bank configuration information. In an embodiment, the method comprises generating memory configuration information, wherein the storing logical memory bank configuration information is based on the generated memory configuration information.

In an embodiment, a non-transitory computer-readable medium's contents cause a processing system to perform a method. The method comprises storing logical memory bank configuration information in one or more configuration registers of a memory interface coupled to a memory of a system-on-a-chip, the memory including one or more physical banks divided into a plurality of sectors, each sector having a size equal to a smallest erasable size of the memory, the stored logical memory bank configuration information assigning each sector of the one or more physical banks of the memory to a respective logical memory bank of one or more logical memory banks. Access to the memory by a processor of the system-on-a-chip is controlled based on the logical memory bank configuration information stored in the one or more configuration registers. In an embodiment, the contents comprise instructions executed by the processing system. In an embodiment, the stored logical memory bank configuration information assigns memory sectors of a same logical memory bank to successive sectors of the one or more physical banks.

In an embodiment, the stored logical memory bank configuration information assigns all of the sectors of the memory to a single logical memory bank. In an embodiment, the stored logical memory bank configuration information defines the single logical memory bank to store compiled code used as a root of trust. In an embodiment, the stored logical memory bank configuration information defines the single logical memory bank to store compiled code of an application.

In an embodiment, the stored logical memory bank configuration information defines a plurality of logical memory banks at different addresses. In an embodiment, the stored logical memory bank configuration information defines a first logical memory bank to store compiled code used as a root of trust and a second logical memory bank to store compiled code of an application. In an embodiment, the stored logical memory bank configuration information defines a first logical memory bank to store compiled code of an application and a second logical memory bank to store an updated version of the compiled code of the application, the first and second logical memory banks having an equal number of assigned memory sectors and being interchangeable. In an embodiment, the stored logical memory bank configuration information defines a first logical memory bank to store compiled code used as a root of trust, a second logical memory bank to store a compiled code of an application, and a third logical bank to store an updated version of the compiled code of the application, the second logical bank and the third logical bank having a same number of assigned memory sectors and being interchangeable.

In an embodiment, the method comprises locking the stored logical memory bank configuration information. In an embodiment, the method comprises generating memory configuration information, wherein the storing logical memory bank configuration information is based on the generated memory configuration information.

In an embodiment, a device comprises a host processor and a system-on-a-chip coupled to the host processor. The system-on-a-chip includes one or more processing cores, a memory, and a memory interface coupled to the one or more processing cores and to the memory. The one or more processing cores, in operation, generate memory access requests. The memory includes one or more physical banks divided into a succession of sectors, each sector having a size equal to a smallest erasable size of the memory. The memory interface includes one or more configuration registers. The memory interface, in response to received memory configuration information, stores logical memory bank configuration information in the one or more configuration registers, the logical memory bank configuration information assigning each sector of the one or more physical banks of the memory to a respective logical memory bank of one or more logical memory banks. In response to receiving a memory access request from the one or more processing cores, the memory interface controls access to the memory based on the logical memory bank configuration information stored in the one or more configuration registers.

In an embodiment, the one or more logical memory banks comprise a single logical memory bank and all of the sectors of the memory are assigned to the single logical memory bank. In an embodiment, the single logical memory bank, in operation, stores compiled code used as a root of trust. In an embodiment, the single logical memory bank, in operation, stores compiled code of an application.

In an embodiment, the one or more logical memory banks comprise a plurality of logical memory banks, and the memory interface defines the plurality of logical memory banks at different addresses. In an embodiment, the stored logical memory bank configuration information defines a first logical memory bank to store compiled code used as a root of trust and a second logical memory bank to store compiled code of an application. In an embodiment, the stored logical memory bank configuration information defines a first logical memory bank to store compiled code of an application and a second logical memory bank to store an updated version of the compiled code of the application, the first and second logical memory banks having an equal number of assigned memory sectors and being interchangeable. In an embodiment, the stored logical memory bank configuration information defines a first logical memory bank to store compiled code used as a root of trust, a second logical memory bank to store a compiled code of an application, and a third logical memory bank to store an updated version of the compiled code of the application, the second logical bank and the third logical bank having a same number of assigned memory sectors and being interchangeable.

In an embodiment, the memory interface, in operation, locks the stored logical memory bank configuration information. In an embodiment, the host processor, in operation, generates the memory configuration information received by the memory interface. In an embodiment, the one or more processing cores, in operation, generate the memory configuration information received by the memory interface.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system-on-a-chip comprising:
a processor, which, in operation, generates memory access requests;
a memory including one or more physical banks divided into a succession of sectors, each sector having a size equal to a smallest erasable size of the memory; and
a memory interface coupled to the memory and to the processor, the memory interface including one or more configuration registers, wherein the memory interface, in operation:
in response to receiving memory configuration information, stores logical memory bank configuration information in the one or more configuration registers, the logical memory bank configuration information assigning each sector of the one or more physical banks of the memory to a respective logical memory bank of a plurality of logical memory banks; and
in response to receiving a memory access request from the processor, controls access to the memory based on the logical memory bank configuration information stored in the one or more configuration registers, wherein,
the memory interface defines the plurality of logical memory banks at different addresses, and
the stored logical memory bank configuration information defines a first logical memory bank to store compiled code of an application and a second logical memory bank to store an updated version of the compiled code of the application, the first and second logical memory banks having an equal number of assigned memory sectors and being interchangeable.

2. The system-on-a-chip according to claim 1, wherein memory sectors assigned to a same logical memory bank are successive sectors of the one or more physical banks.

3. The system-on-a-chip according to claim 1, wherein the stored logical memory bank configuration information defines a third logical memory bank to store compiled code used as a root of trust.

4. The system-on-a-chip according to claim 1, wherein the memory interface, in operation, locks the stored logical memory bank configuration information.

5. The system-on-a-chip of claim 1, wherein the processor, in operation, generates the memory configuration information received by the memory interface.

6. A method, comprising:
storing logical memory bank configuration information in one or more configuration registers of a memory interface coupled to a memory of a system-on-a-chip, the memory including one or more physical banks divided into a plurality of sectors, each sector having a size equal to a smallest erasable size of the memory, the stored logical memory bank configuration information assigning each sector of the one or more physical banks of the memory to a respective logical memory bank of a plurality of logical memory banks, wherein the stored logical memory bank configuration information defines the plurality of logical memory banks at different addresses; and
controlling access to the memory by a processor of the system-on-a-chip based on the logical memory bank configuration information stored in the one or more configuration registers, wherein the stored logical memory bank configuration information defines a first logical memory bank to store compiled code of an application and a second logical memory bank to store an updated version of the compiled code of the application, the first and second logical memory banks having an equal number of assigned memory sectors and being interchangeable.

7. The method according to claim 6, wherein the stored logical memory bank configuration information assigns memory sectors of a same logical memory bank to successive sectors of the one or more physical banks.

8. The method according to claim 6, wherein the stored logical memory bank configuration information defines a third logical memory bank to store compiled code used as a root of trust.

9. The method according to claim 6, comprising locking the stored logical memory bank configuration information.

10. The method according to claim 6, comprising generating memory configuration information, wherein the storing logical memory bank configuration information is based on the generated memory configuration information.

11. A non-transitory computer-readable medium having contents which cause a processing system to perform a method, the method comprising:
storing logical memory bank configuration information in one or more configuration registers of a memory interface coupled to a memory of a system-on-a-chip, the memory including one or more physical banks divided into a plurality of sectors, each sector having a size equal to a smallest erasable size of the memory, the stored logical memory bank configuration information assigning each sector of the one or more physical banks of the memory to a respective logical memory bank of a plurality of logical memory banks; and
controlling access to the memory by a processor of the system-on-a-chip based on the logical memory bank configuration information stored in the one or more configuration registers, wherein, the memory interface defines the plurality of logical memory banks at different addresses, and the stored logical memory bank configuration information defines a first logical memory bank to store compiled code of an application and a second logical memory bank to store an updated version of the compiled code of the application, the first and second logical memory banks having an equal number of assigned memory sectors and being interchangeable.

12. The non-transitory computer-readable medium of claim 11, wherein the stored logical memory bank configuration information defines a third logical memory bank to store compiled code used as a root of trust.

13. The non-transitory computer-readable medium of claim 11, wherein the method comprises locking the stored logical memory bank configuration information.

14. The non-transitory computer-readable medium of claim 11, wherein the contents comprise instructions executed by the processing system.

15. A device, comprising:
a host processor; and
a system-on-a-chip coupled to the host processor, the system-on-a-chip having:
  one or more processing cores, which, in operation, generate memory access requests;
  a memory including one or more physical banks divided into a succession of sectors, each sector having a size equal to a smallest erasable size of the memory; and
  a memory interface coupled to the memory and to the one or more processing cores, the memory interface including one or more configuration registers, wherein the memory interface, in operation:
    in response to receiving memory configuration information, stores logical memory bank configuration information in the one or more configuration registers, the logical memory bank configuration information assigning each sector of the one or more physical banks of the memory to a respective logical memory bank of a plurality of logical memory banks; and
    in response to receiving a memory access request from the one or more processing cores, controls access to the memory based on the logical memory bank configuration information stored in the one or more configuration registers, wherein,
  the memory interface defines the plurality of logical memory banks at different addresses, and
  the stored logical memory bank configuration information defines a first logical memory bank to store compiled code of an application and a second logical memory bank to store an updated version of the compiled code of the application, the first and second logical memory banks having an equal number of assigned memory sectors and being interchangeable.

16. The device according to claim 15, wherein the stored logical memory bank configuration information defines a third logical memory bank to store compiled code used as a root of trust.

17. The device according to claim 16, wherein the memory interface, in operation, locks the stored logical memory bank configuration information.

18. The device according to claim 15, wherein the host processor, in operation, generates the memory configuration information received by the memory interface.

19. The device according to claim 15, wherein the one or more processing cores, in operation, generate the memory configuration information received by the memory interface.

\* \* \* \* \*